United States Patent
Pu et al.

(10) Patent No.: US 7,888,236 B2
(45) Date of Patent: Feb. 15, 2011

(54) SEMICONDUCTOR DEVICE AND FABRICATION METHODS THEREOF

(75) Inventors: Han-Ping Pu, Taichung (TW); Bai-Yao Lou, Hsinchu (TW); Dean Wang, Tainan (TW); Ching-Wen Hsiao, Taipei (TW); Kai-Ming Ching, Hsinchu (TW); Chen-Cheng Kuo, Hsinchu (TW); Wen-Chih Chiou, Miaoli (TW); Ding-Chung Lu, Hsinchu (TW); Shang-Yun Hou, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 470 days.

(21) Appl. No.: 11/798,432

(22) Filed: May 14, 2007

(65) Prior Publication Data

US 2008/0286938 A1 Nov. 20, 2008

(51) Int. Cl.
*H01L 21/00* (2006.01)
(52) U.S. Cl. .................. 438/462; 438/460; 438/113; 257/E21.596
(58) Field of Classification Search .............. 438/113, 438/460, 462; 257/E21.596
See application file for complete search history.

(56) References Cited

U.S. PATENT DOCUMENTS

| 5,872,025 | A | 2/1999 | Cronin et al. |
| 6,562,647 | B2 * | 5/2003 | Zandman et al. ............... 438/33 |
| 6,607,941 | B2 * | 8/2003 | Prabhu et al. ................ 438/113 |
| 7,183,136 | B2 | 2/2007 | Hashimura et al. |
| 7,294,937 | B2 | 11/2007 | Su et al. |
| 2005/0186760 | A1 * | 8/2005 | Hashimura et al. .......... 438/460 |
| 2006/0079025 | A1 * | 4/2006 | Kripesh et al. .............. 438/113 |
| 2006/0276009 | A1 * | 12/2006 | Kurogi ....................... 438/460 |

FOREIGN PATENT DOCUMENTS

| CN | 1484328 A | 3/2004 |
| CN | 1538506 A | 10/2004 |

* cited by examiner

*Primary Examiner*—Alexander G Ghyka
*Assistant Examiner*—Seahvosh J Nikmanesh
(74) *Attorney, Agent, or Firm*—Birch, Stewart, Kolasch & Birch, LLP

(57) ABSTRACT

A method for packaging a semiconductor device disclosed. A substrate comprising a plurality of dies, separated by scribe line areas respectively is provided, wherein at least one layer is overlying the substrate. A portion of the layer within the scribe lines area is removed by photolithography and etching to form openings. The substrate is sawed along the scribe line areas, passing the openings. In alternative embodiment, a first substrate comprising a plurality of first dies separated by first scribe line areas respectively is provided, wherein at least one first structural layer is overlying the first substrate. The first structural layer is patterned to form first openings within the first scribe line areas. A second substrate comprising a plurality of second dies separated by second scribe line areas respectively is provided, wherein at least one second structural layer is overlying the substrate. The second structural layer is patterned to form second openings within the second scribe line areas. The first substrate and the second substrate are bonded to form a stack structure. The stack structure is cut along the first and second scribe line areas, passing the first and second openings.

10 Claims, 18 Drawing Sheets

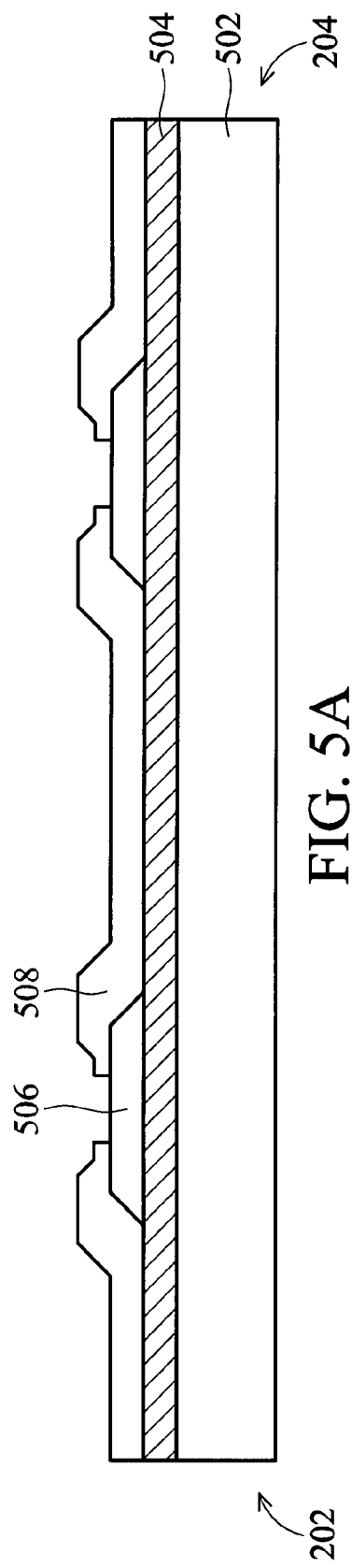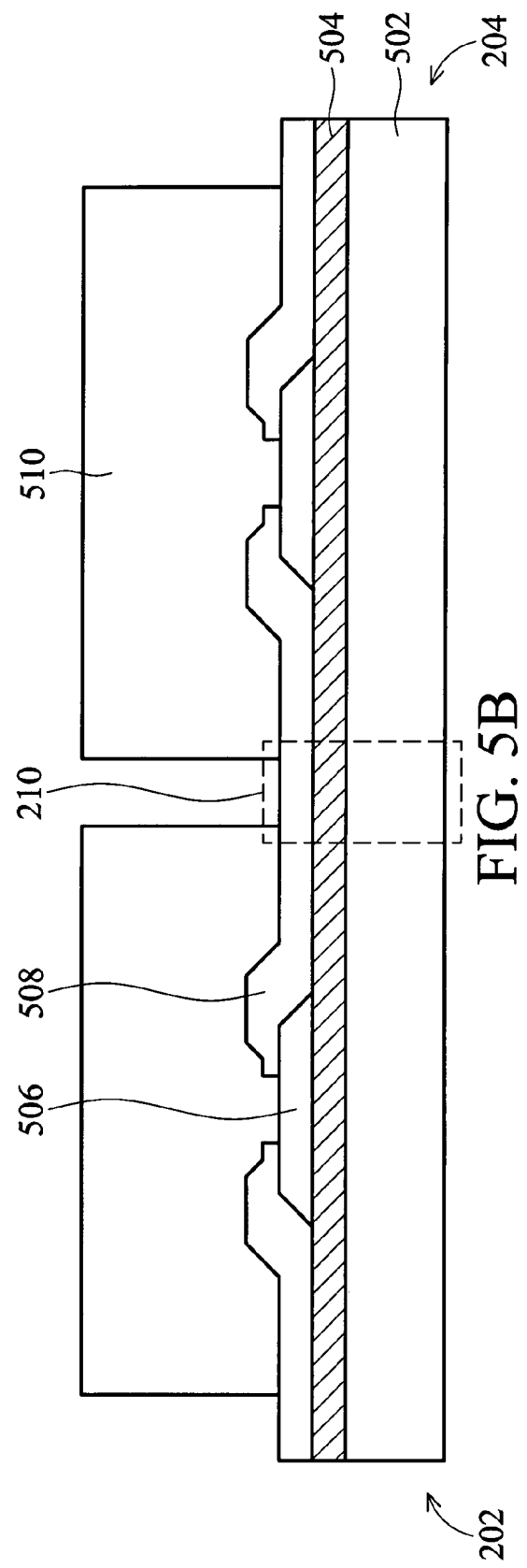

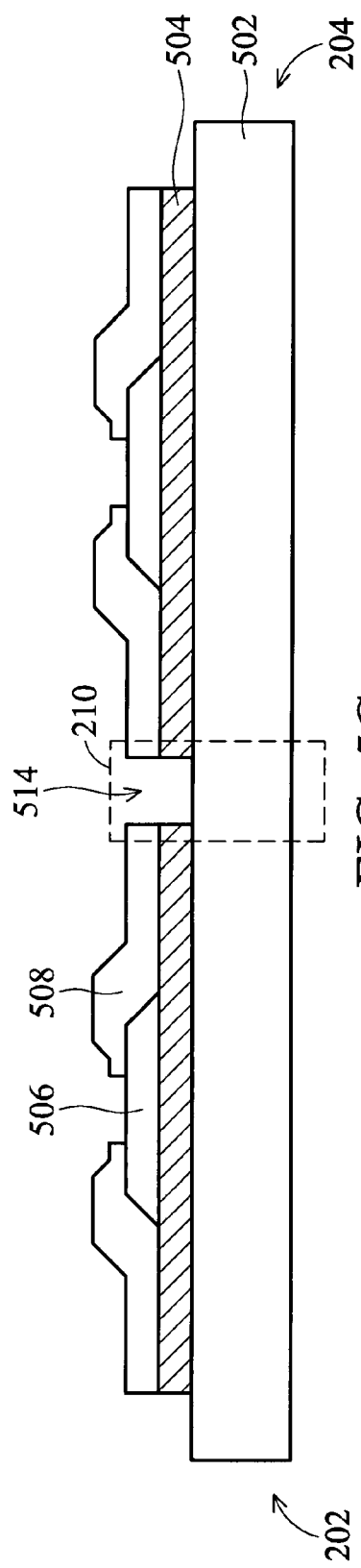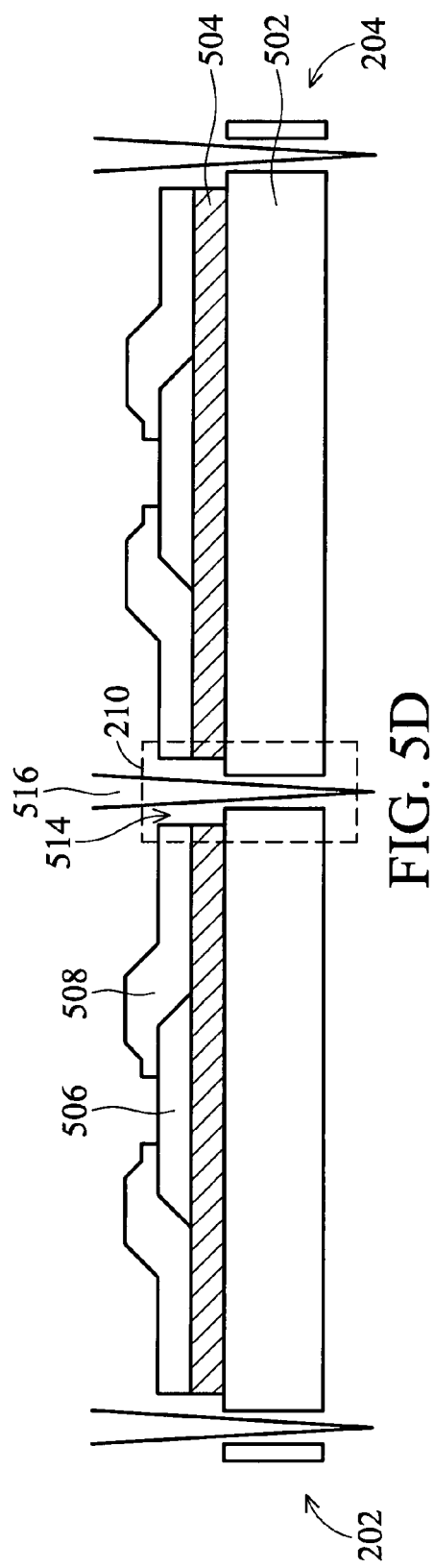

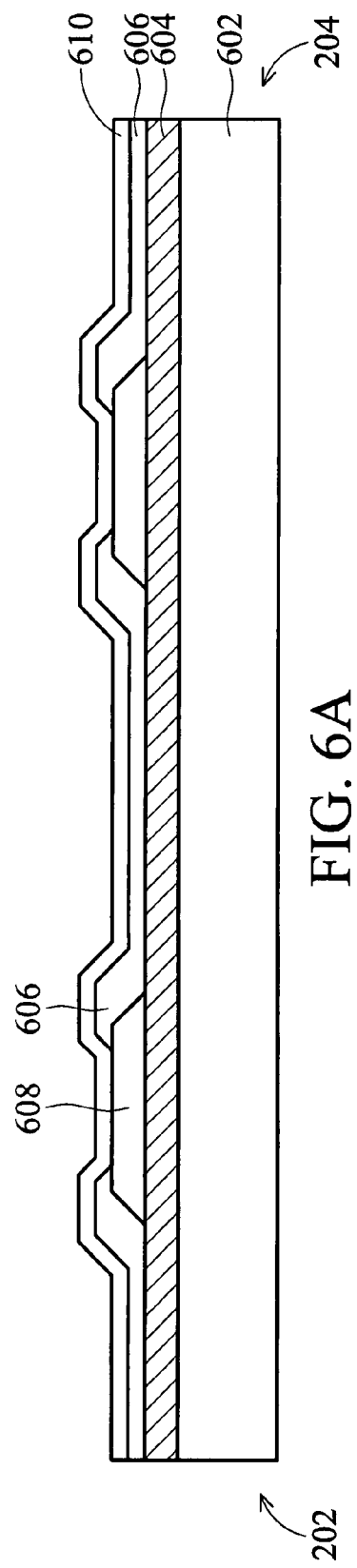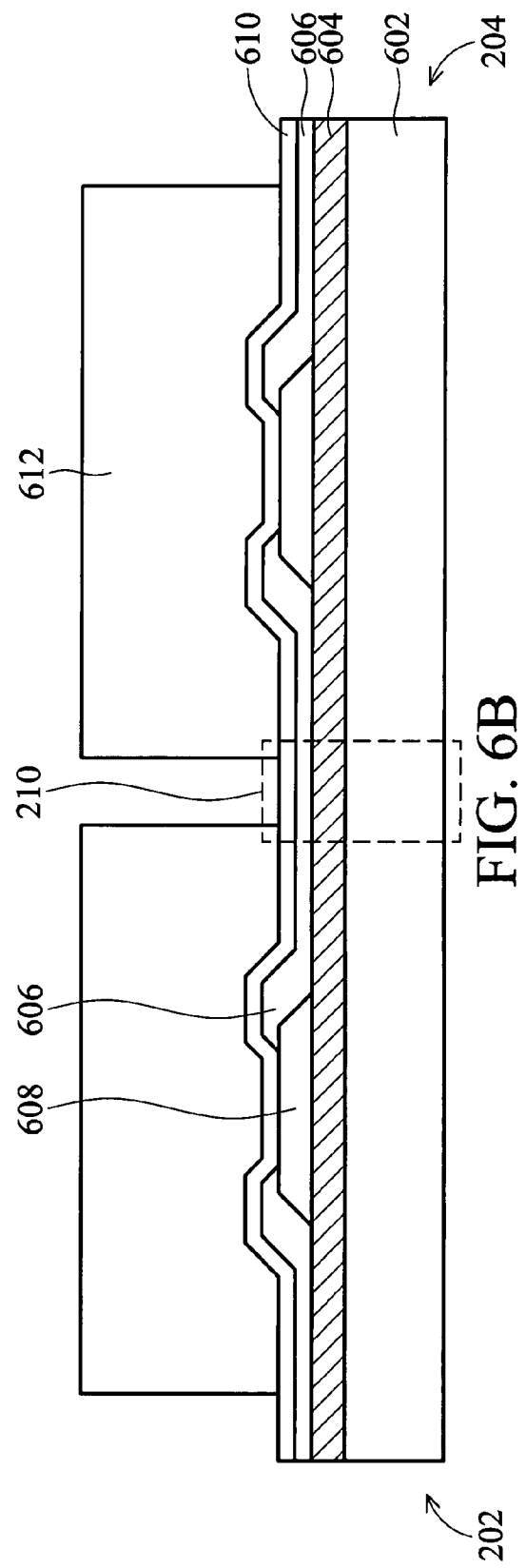

SEMICONDUCTOR DEVICE AND FABRICATION METHODS THEREOF

BACKGROUND OF THE INVENTION

1. Field of the Invention

The present invention relates to a semiconductor device and fabrication methods thereof, and in particular relates to a sawing process of semiconductor fabrications.

2. Description of the Related Art

The semiconductor industry continuously strives to reduce the size and cost of integrated circuits. One method for measuring the performance of an integrated circuit uses the maximum clock speed at which the circuit operates reliably, which depends on how fast transistors can be switched and how fast signals can propagate.

One particular problem confronting the semiconductor industry is that, as integrated circuit scaling continues, the performance improvement is limited by the signal delay time attributable to interconnects in the integrated circuit. According to one definition, integrated circuit interconnects are three-dimensional metal lines with submicrometer cross sections surrounded by insulating material. One definition of an interconnect delay is the product of the interconnect resistance (R) and the parasitic capacitance (C) for the interconnect metal to the adjacent layers. Because of the progressive scaling, the parasitic capacitance (C) has significantly increased due to closer routing of wires, and the interconnect resistance (R) has significantly increased due to a continuous reduction of the wire section. As such, it is desirable to lower the interconnect RC time constant by using materials with a low dielectric constant (k).

Low dielectric constant materials generate many issues when used in semiconductor processes. FIG. 1A~FIG. 1C show an issue associated with low dielectric constant materials during sawing process. In FIG. 1A, a wafer comprises a plurality of dies, separated by scribe line areas 110. FIG. 1B is an enlarged view of FIG. 1A, which shows dies 102, 104, 106 and 108 are separated by scribe line areas 110. The dies comprise seal rings 112 formed of metal for protecting devices in the dies. Referring to FIG. 1C, after finalizing process steps of semiconductor devices of the dies 102, 104, 106 and 108, the wafer 100 are sawed to separate the dies 102, 104, 106 and 108 for further packaging. The sawing path 114 in the scribe line area is shown in FIG. 1C. Due to stress concentration, peeling 118 or chipping 116, however, is likely to occur at corners of the dies 102, 104, 106 and 108. Specifically, when inter metal dielectric layers of the semiconductor devices use low dielectric constant materials, peeling 118 is more like to occur, and furthermore, delamination is also generated.

In FIG. 1D, the wafer 100 further comprises a plurality of test keys 122 disposed in the scribe line areas 110 for monitoring electric characteristics of the semiconductor devices in the dies 102, 104, 106 and 108 in intermediate stages of fabrications thereof. As shown in this figure, crack or peeling 120 is likely to occur at locations neighboring the test keys 122 during sawing. The crack, peeling or delamination 120 sometimes exceeds the seal ring 112, therefore reducing yield of semiconductor devices.

BRIEF SUMMARY OF INVENTION

A detailed description is given in the following embodiments with reference to the accompanying drawings. These and other problems are generally solved or circumvented, and technical advantages are generally achieved, by preferred illustrative embodiments of the present invention, which provide a semiconductor device and package methods thereof.

In an embodiment of the invention, a method for packaging a semiconductor device disclosed. A substrate comprising a plurality of dies, separated by scribe line areas respectively is provided, wherein at least one layer is overlying the substrate. A portion of the layer within the scribe lines area is removed by photolithography and etching to form openings. The substrate is sawed along the scribe line areas, passing the openings.

In alternative embodiment of the invention, method for forming a device is disclosed. A first substrate comprising a plurality of first dies separated by first scribe line areas respectively is provided, wherein at least one first structural layer is overlying the first substrate. The first structural layer is patterned to form first openings within the first scribe line areas. A second substrate comprising a plurality of second dies separated by second scribe line areas respectively is provided, wherein at least one second structural layer is overlying the substrate. The second structural layer is patterned to form second openings within the second scribe line areas. The first substrate and the second substrate are bonded to form a stack structure. The stack, structure is cut along the first and second scribe line areas, passing the first and second openings.

BRIEF DESCRIPTION OF DRAWINGS

The present invention can be more fully understood by reading the subsequent detailed description and examples with references made to the accompanying drawings, wherein:

FIGS. 5A-5D show a method for eliminate crack, peeling or delamination of dies of an embodiment of the invention in a cross section view.

FIGS. 6A-6E show a method for eliminating crack, peeling or delamination of dies of another embodiment of the invention in a cross section view.

DETAILED DESCRIPTION OF INVENTION

Figure 1A:
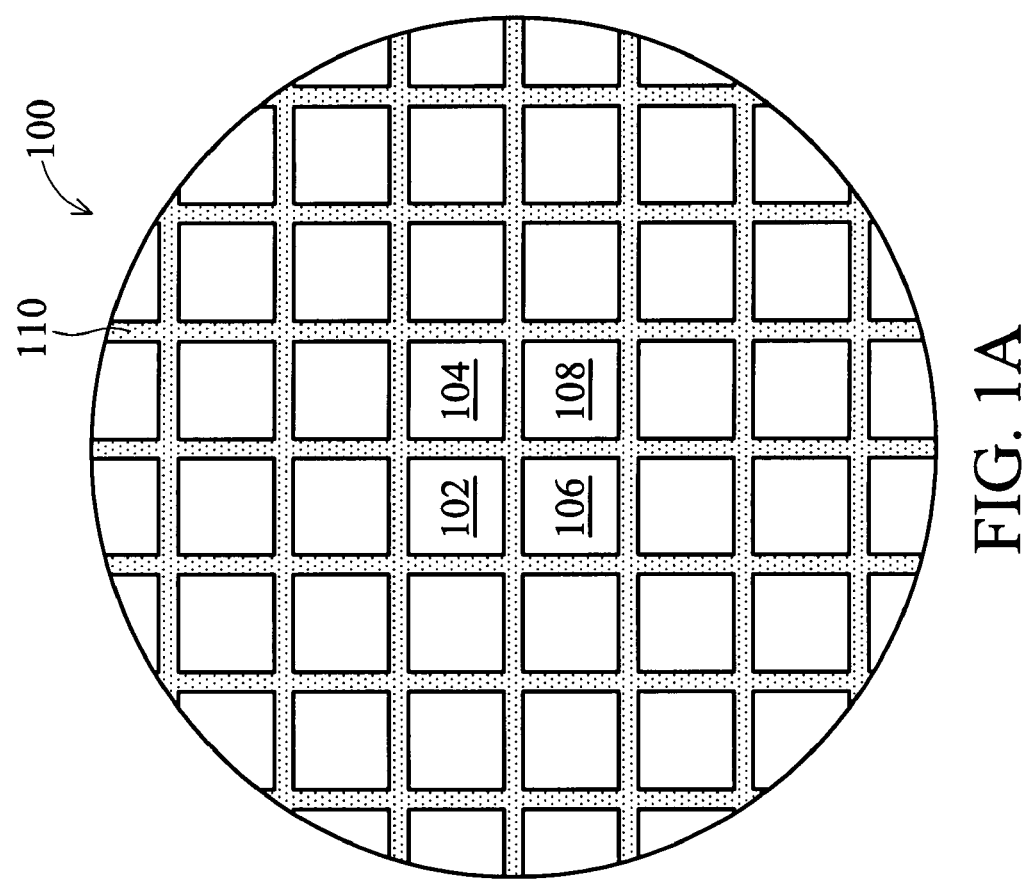
FIGS. 1A-1C show an issue associated with low dielectric constant materials during sawing process.
Figure 1B:
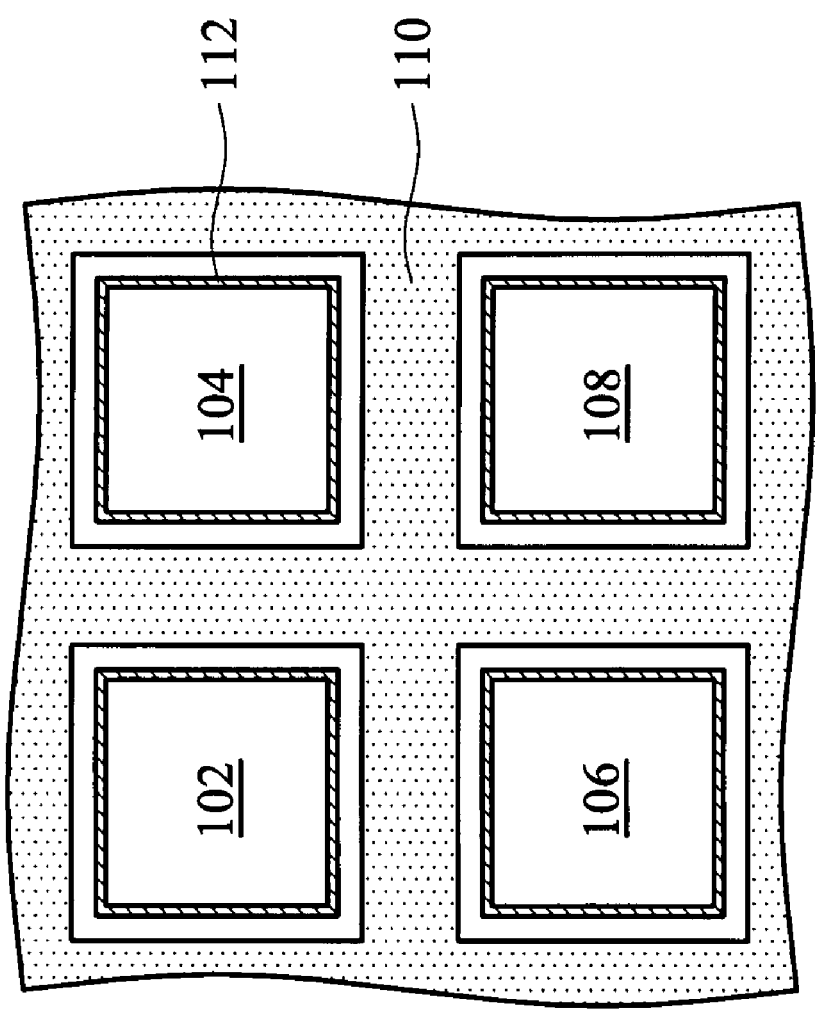
Figure 1C:
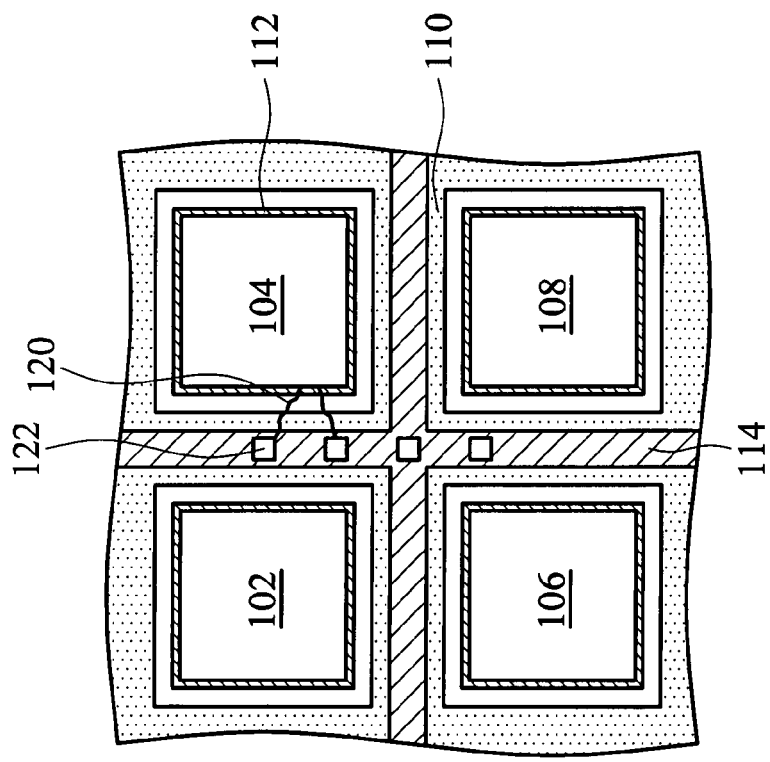
Figure 1D:
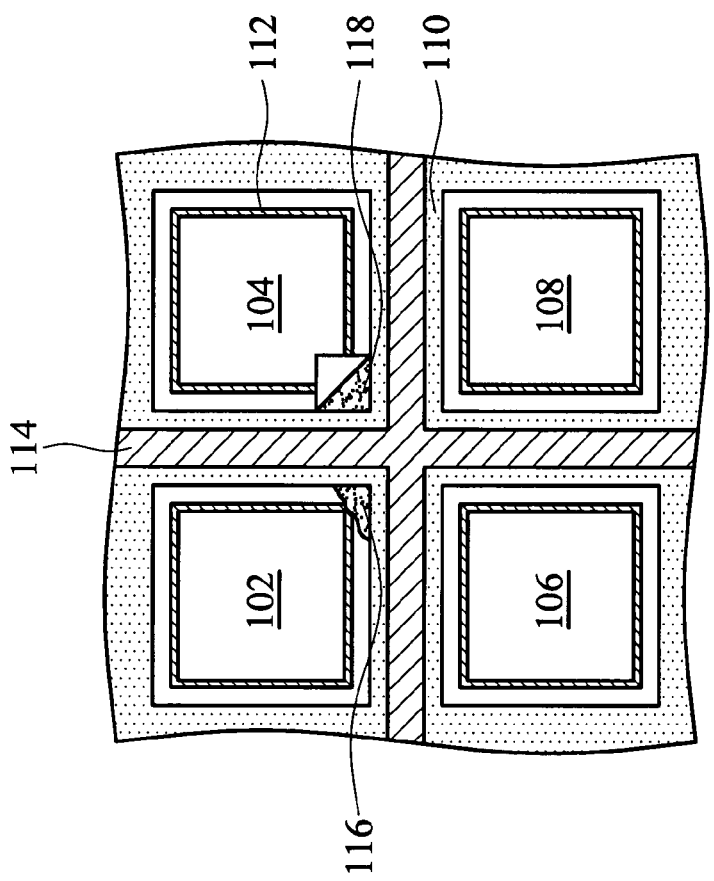
FIGS. 1D shows another issue during sawing process.

The following description is of the best-contemplated mode of carrying out the invention. This description is made for the purpose of illustrating the general principles of the invention and should not be taken in a limiting sense. The scope of the invention is best determined by reference to the appended claims. Embodiments of the invention, which provides a semiconductor device and fabrications thereof, will be described in greater detail by referring to the drawings that accompany the invention. It is noted that in the accompanying drawings, like and/or corresponding elements are referred to by like reference numerals.

Figure 2A:
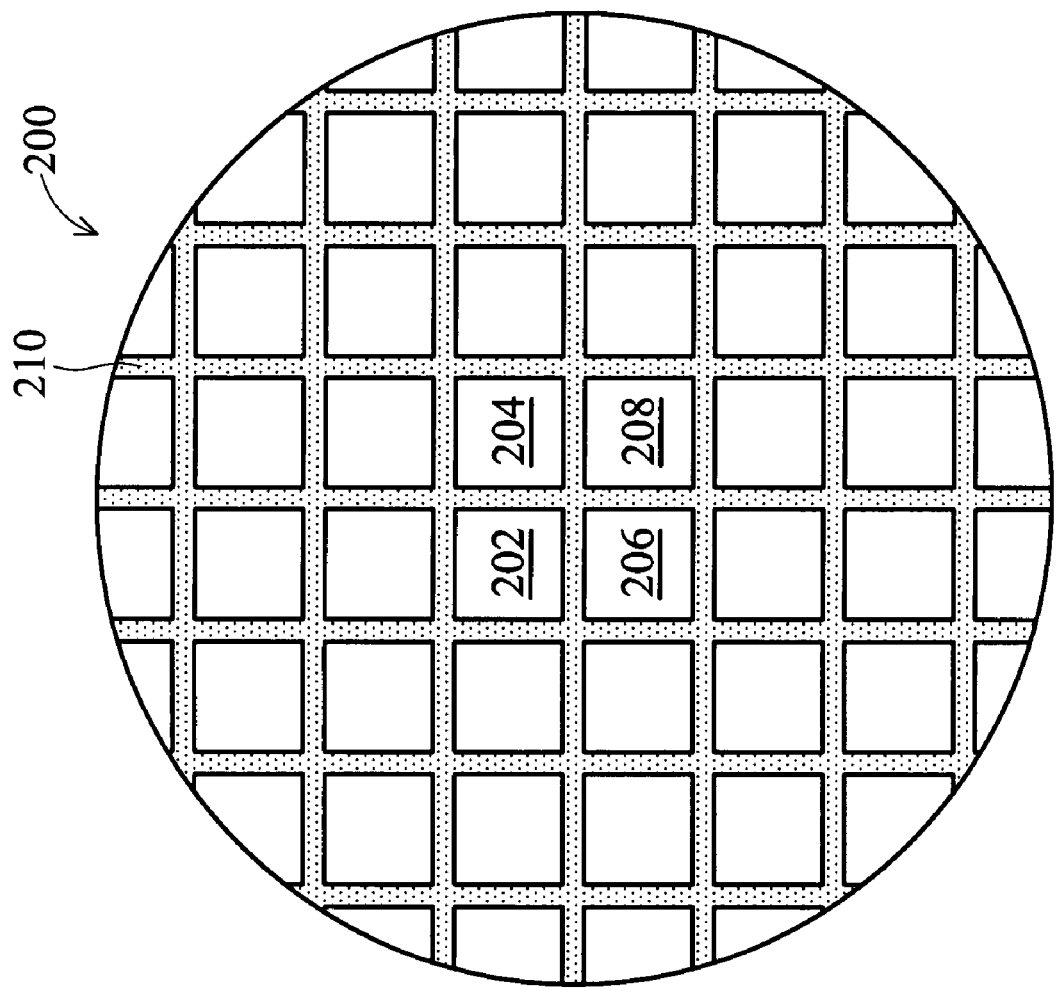
FIGS. 2A-2C shows a method for eliminating crack, peeling or delamination of dies of an embodiment of the invention.
Figure 2C:
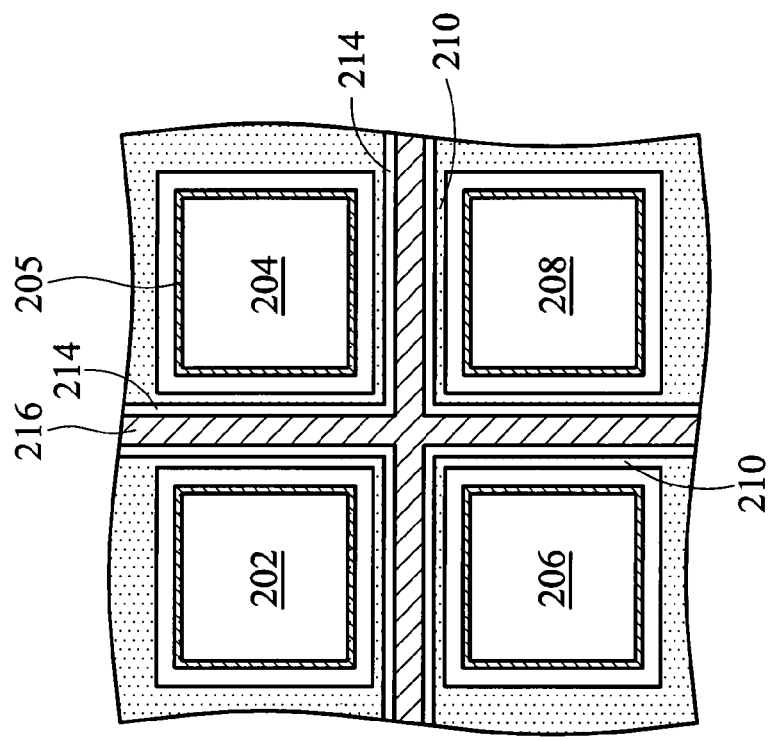
Figure 2B:
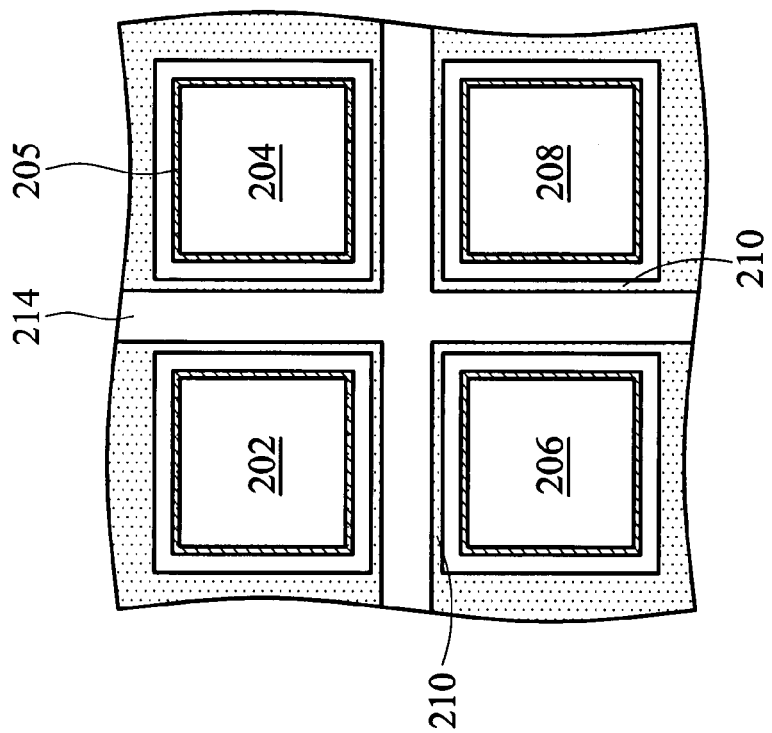

FIGS. 2A-2C shows a method for eliminating crack, peeling or delamination of dies of an embodiment of the invention. In FIG. 2A, a wafer 200 comprises a plurality of dies, separated by scribe line areas 210. Each die comprises a plurality of semiconductor devices, in which they may be logic devices, memory devices or combinations thereof. The semiconductor devices may comprise, a substrate, gate dielectric layers, gate stacks, capacitors, metal lines, vias, inert metal dielectric layers and/or inert layer dielectric layers, which are not shown in the plan view for simplifying. In an embodiment of the invention, the inert metal dielectric layers and/or inert layer dielectric layers comprise low dielectric constant materials for lowering the interconnect RC time of the semiconductor device, in which the low dielectric constant materials preferably has a dielectric constant less than 2.8, and more preferably less than 2.5.

FIG. 2B is an enlarged view of FIG. 2A, which shows dies 202, 204, 206 and 208 are separated by scribe line areas 210. Each die comprises a seal ring 205 formed of metal for protecting devices in the die. In an embodiment of the invention, before sawing the substrate along scribe line areas 210, a portion of a layer or layers on the substrate and within the scribe line area 210 are removed by photolithography and etching to form an opening 214. The removed layers may comprise dielectric layers formed during formation of gate dielectric layer, inter metal dielectric layer or interlayer dielectric layer, or conductive layer formed during formation of metal lines. Therefore, as shown in FIG. 2C, since a portion of a layer or layers on the substrate and within the scribe line area 210 are removed by photolithography and etching, sawing process can directly cut the substrate and the sawing path 216 does not contact the layers. Therefore, crack, peeling or delamination is less likely to occur because the high stress layers or weak layers, such as low dielectric constant layers, are previously removed.

Figure 3A:
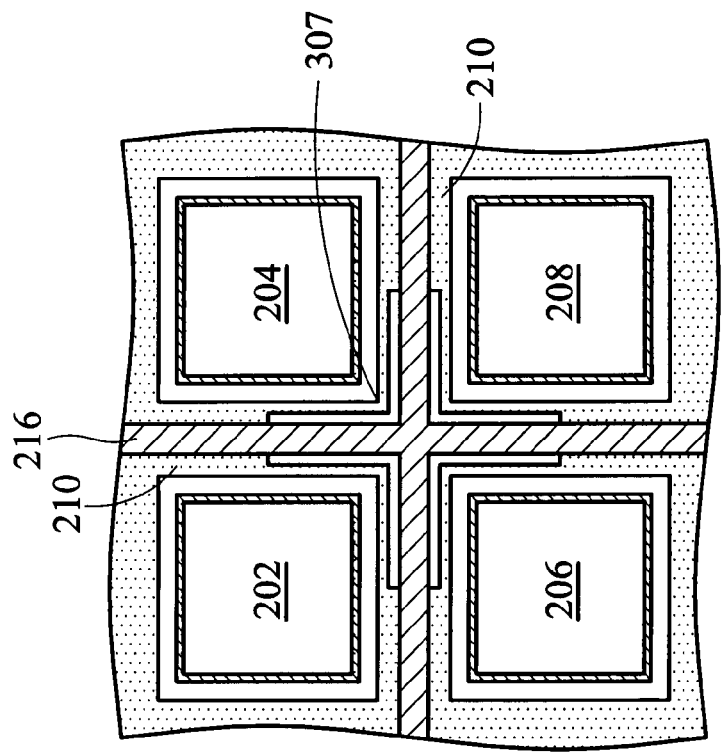
FIGS. 3A-3B show a method for eliminating crack, peeling or delamination of dies of another embodiment of the invention.
Figure 3B:
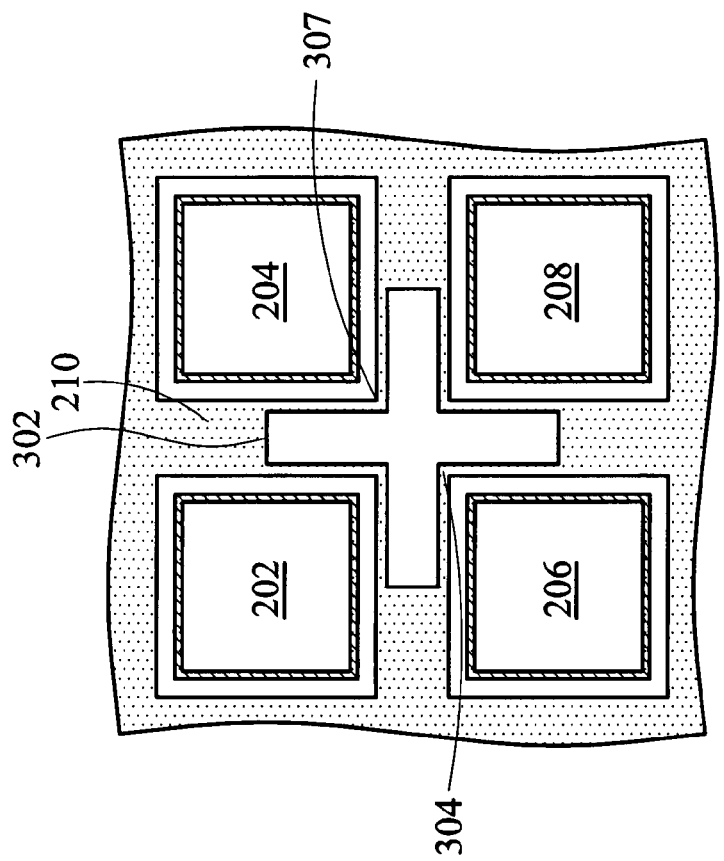

FIGS. 3A-3B show a method for eliminating crack, peeling or delamination of dies of another embodiment of the invention. Like the embodiment described, each die comprises a plurality of semiconductor devices, in which they may be logic devices, memory devices or combinations thereof. The semiconductor devices may comprise, a substrate, gate dielectric layers, gate stacks, capacitors, metal lines, vias, inert metal dielectric layers and/or inert layer dielectric layers, which is not shown in the plan view for simplifying. In an embodiment of the invention, the inert metal dielectric layers and/or inert layer dielectric layer comprise low dielectric constant materials for lowering the interconnect RC time of the semiconductor device.

As described in background, crack, peeling or delamination often occurs neighboring comers 307 of the dies 202, 204, 206 and 208 because this portion is a high stress region and is sawed twice by a vertical sawing and a horizontal sawing. In this embodiment, as shown in FIG. 3B, before sawing the substrate along scribe line areas 210, a portion of a layer or layers on the substrate, within the scribe line area 210 and neighboring comers 307 of the dies 202, 204, 206 and 208 are removed by photolithography and etching to form an opening 302. Note that the opening 302 can be cross shape, and preferably expose the substrate. Therefore, since a portions of the layers within the scribe line area 210 and neighboring comers 307 of the dies 202, 204, 206 and 208 are removed, defects generated during sawing 216 can be effectually eliminated.

Figure 4B:
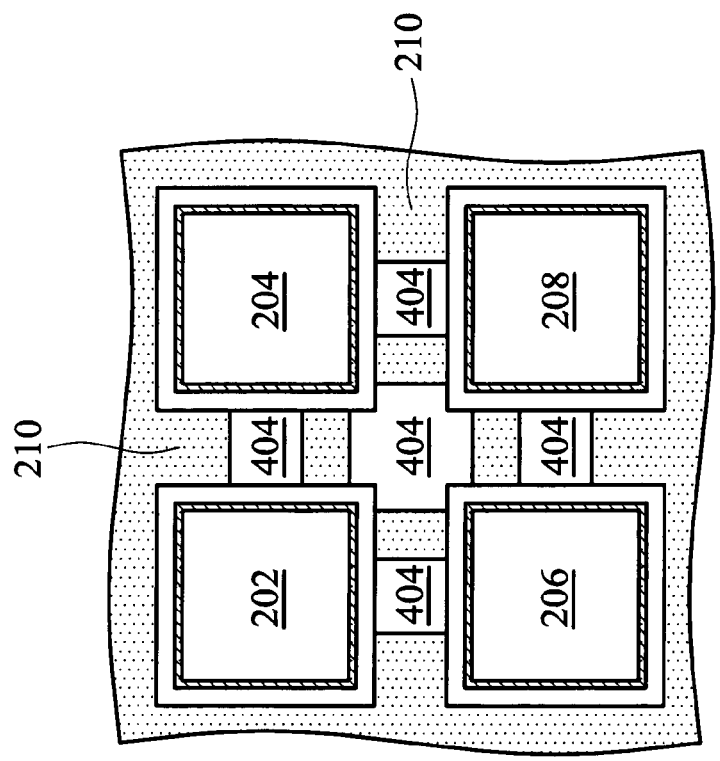
FIGS. 4A-4B show a method for eliminate crack, peeling or delamination of dies of further another embodiment of the invention.
Figure 4A:
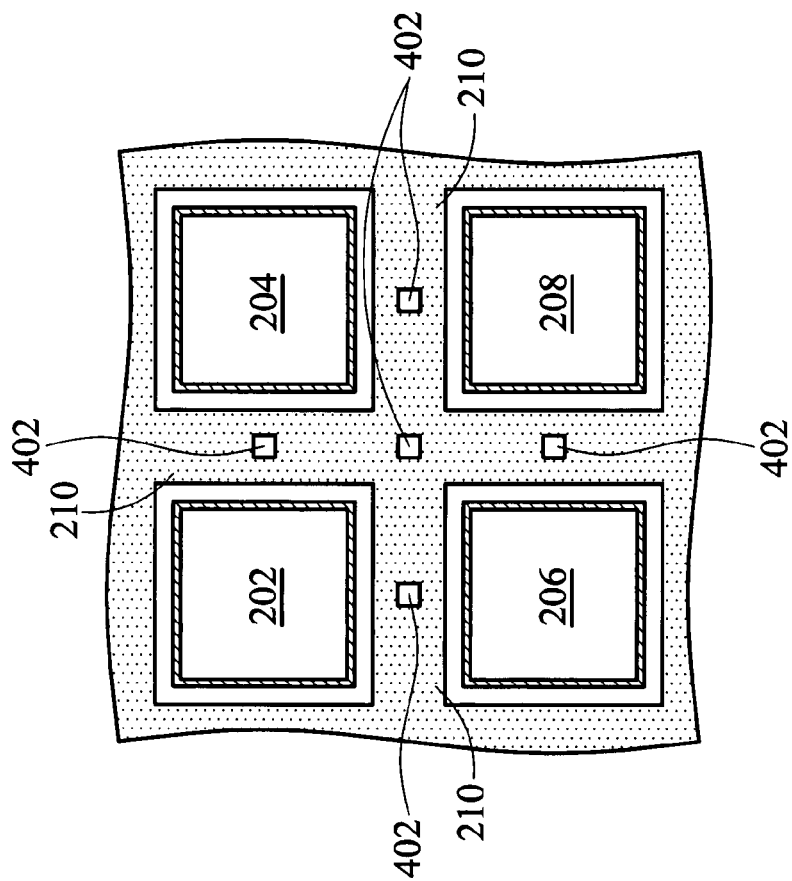

FIGS. 4A-4B show a method for eliminate crack, peeling or delamination of dies of further another embodiment of the invention. Like the embodiment described, each die comprises a plurality of semiconductor devices, in which they may be logic devices, memory devices or combinations thereof. The semiconductor devices may comprise, a substrate, gate dielectric layers, gate stacks, capacitors, metal lines, vias, inert metal dielectric layers and/or inert layer dielectric layers, which is not shown in the plan view for simplifying. In an embodiment of the invention, the inert metal dielectric layers and/or inert layer dielectric layer comprise low dielectric constant materials for lowering the interconnect RC time of the semiconductor device. In addition, the wafer further comprises a plurality of test keys 402 in the scribe line areas 210 for monitoring electric characteristics of the semiconductor devices in the dies 202, 204, 206 and 208 in intermediate stages of fabrications thereof.

As described in background, defects, such as crack, peeling or delamination, often occur at locations neighboring the test keys 402 during sawing. Therefore, in this embodiment, before sawing the substrate along scribe line areas 210, a portion of a layer or layers on the substrate, within the scribe line area 210 and neighboring the test keys 402 are removed by photolithography and etching to form openings 404, as showing in FIG. 4B. Note that the openings 404 preferably expose the substrate and remove the corresponding test keys 402. Consequently, since a portions of the layers within the scribe line area 210 and neighboring the test keys 402 are removed, defects generated during sawing can be effectually eliminated.

FIGS. 5A-5D show a method for eliminate crack, peeling or delamination of dies of an embodiment of the invention in a cross section view. Referring to FIG. 5A, a substrate 502 is provided. The substrate 502 may include an elementary semiconductor, such as crystal silicon, amorphous silicon, and/or germanium; a compound semiconductor, such as silicon carbide and/or gallium arsenic; an alloy semiconductor, such as SiGe, GaAsP, AlInAs, and/or GaInP. Further, the substrate 502 may include a bulk semiconductor, such as bulk silicon, and such a bulk semiconductor may include an epi silicon layer. It may also or alternatively include a semiconductor-on-insulator substrate, such as silicon-on-insulator (SOI) substrate, or a thin-film-transistor substrate. The substrate 502 may also or alternatively include a multiple silicon structure or a multilayer compound semiconductor structure. In a preferred embodiment of the invention, the substrate is silicon substrate.

Next, transistors comprising sources, drains, gate electrodes and gate dielectric layers, capacitors and/or other electric elements are formed on the substrate 502, in which they are not shown for simplifying. An interconnection layer 504 comprising metal lines, vias, inter metal dielectric layers and/or inter layer dielectric layers are formed on the electric elements described. The inter metal dielectric layers and/or inter layer dielectric layers can comprise silicon oxide, silicon nitrides or silicon oxynitride, but preferably comprise low dielectric constant materials, such as Diamond-Like-Carbon, FSG, SILK™ developed by Dow Chemical, Orion™ developed by Trikon Technologies, FLARE™ developed by Honeywell, LKD developed by JSR Micro, Xerogel, Aerogel or other materials. Thereafter, a plurality of bonding pads 506 are formed on the interconnection layer 504, and a passivation layer 508, such as silicon nitride, is then from on the bonding pad 506 and the interconnection layer 504. Followed by patterning the passivation layer 508 by lithography and etching to expose portions of the bonding pads 506.

Referring to FIG. 5B, a photoresist layer (not shown) is formed on the passivation layer 508 and the bonding pad 506, and then defined by photolithography to form photoresist patterns 510. Note that the photoresist patterns 510 cover the dies 202 and 204, but expose the scribe line areas 210 between dies 202 and 204. Next, Referring to FIG. 5C, the layers (comprising the interconnection layer 504 and the passivation layer 508) on the substrate 502 are etched using the photoresist patterns 510 as a mask to form openings 514 within the scribe line area 210 and exposing the substrate 502. Thereafter, the photoresist patterns 510 are removed. Referring to FIG. 5D, the wafer is then sawed by a sawing blade 516. Note that since portions of the layers on the substrate 502 in the scribe line areas 210 are previously removed before sawing, the saw blade 516 can directly cut the substrate 502 without affecting the layers 504 and 508. Consequently, defects generated from the layers 504 and 508 during sawing can be effectually eliminated.

Figure 6C:
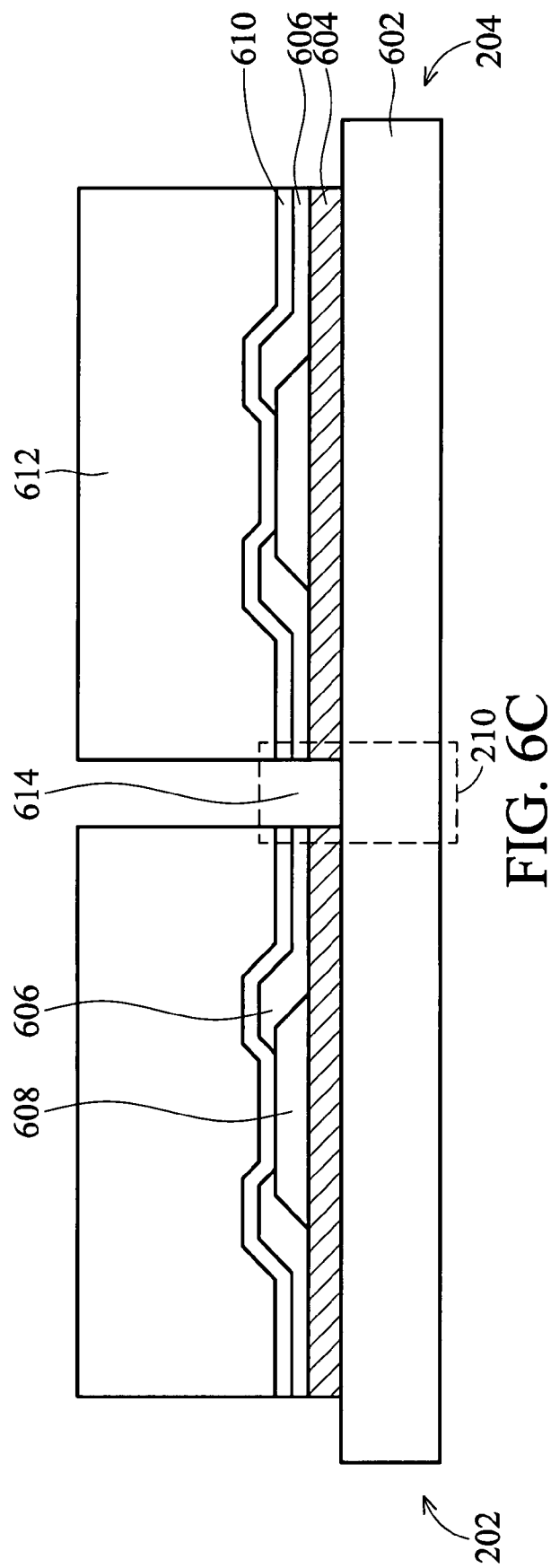

FIGS. 6A~6E show a method for eliminating crack, peeling or delamination of dies of another embodiment of the invention in a cross section view. Referring to FIG. 6A, a substrate 602 is provided. Next, transistors comprising sources, drains, gate electrodes and gate dielectric layers, capacitors and/or other electric elements are formed on the substrate 602, in which they are not shown for simplifying. An interconnection layer 604 comprising metal lines, vias, inter metal dielectric layers and/or inter layer dielectric layers are formed on the electric elements described. The inter metal dielectric layers and/or inter layer dielectric layers can comprise silicon oxide, silicon nitride or silicon oxynitride but preferably comprise low dielectric constant materials, such as Diamond-Like-Carbon, FSG, SILK™ developed by Dow Chemical, Orion™ developed by Trikon Technologies, FLARE™ developed by Honeywell, LKD developed by JSR Micro, Xerogel, Aerogel or other materials. Thereafter, a plurality of bonding pads 608 are formed on the interconnection layer 604, and a passivation layer 606, such as silicon nitride, is then from on the bonding pad 608 and the interconnection layer 604. Followed by patterning the passivation layer 606 by lithography and etching to expose portions of the bonding pads 608. Thereafter, a under bump layer (UBM) 610 is formed on the bonding pad 608 and the passivation layer 606.

Figure 6D:
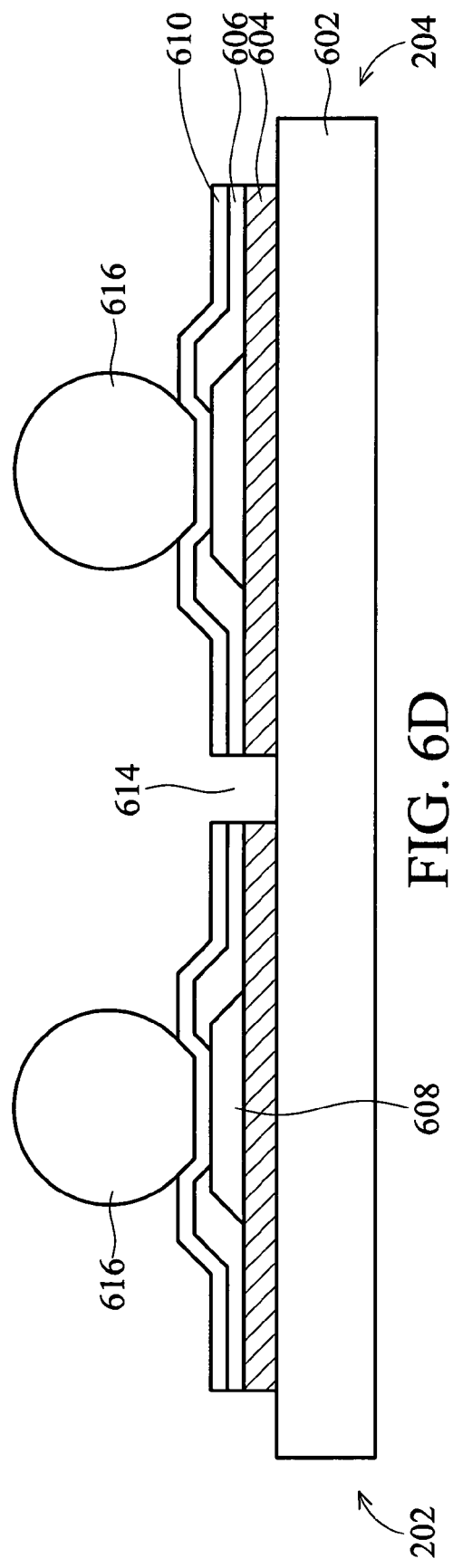
Figure 6E:
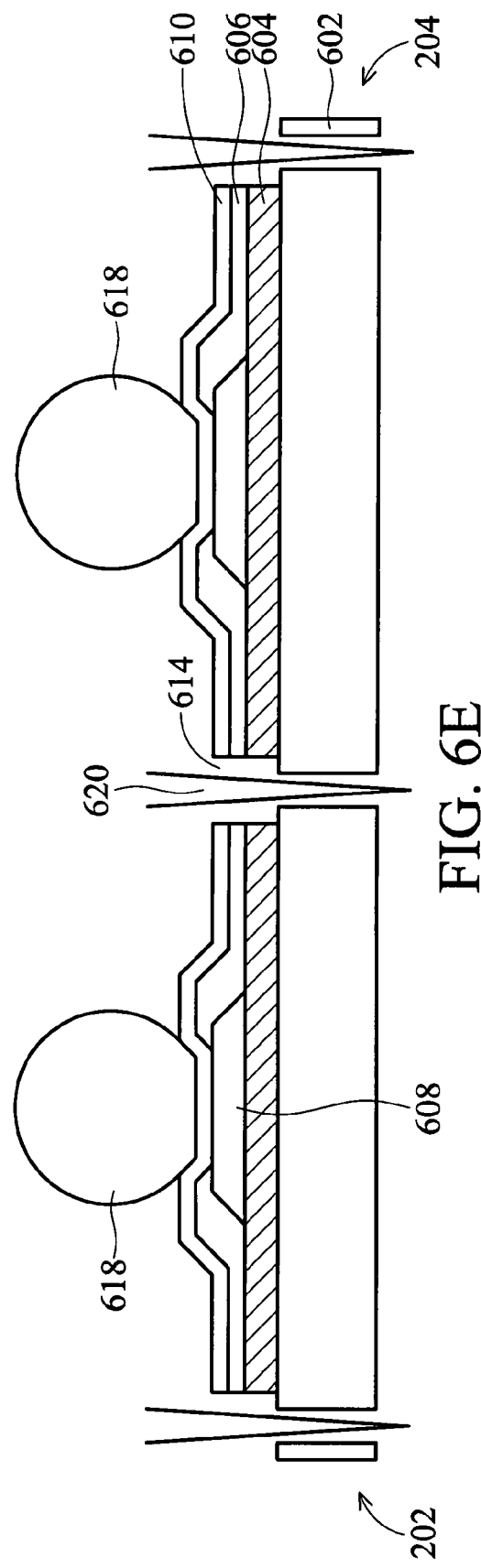

Referring to FIG. 6B, a photoresist layer (not shown) is formed on the under bump layer 610, and then defined by photolithography to form photoresist patterns 612. Note that the photoresist patterns 612 cover the dies 202 and 204, but expose the scribe line areas 210 between dies 202 and 204. Next, Referring to FIG. 6C, the layers (comprising the interconnection layer 604 and the passivation layer 606) on the substrate 602 are etched using the photoresist patterns 612 as a mask to form openings 614 within the scribe line area 210 and exposing the substrate 602. Referring to FIG. 6D, the photoresist pattern is removed, and then bump balls 616 are formed on the under bump layer 610. Referring to FIG. 6E, the wafer is sawed by a sawing blade 620. Note that since portions of the layers on the substrate 602 in the scribe line areas 210 are previously removed before sawing, the saw blade 620 can directly cut the substrate 602 without affecting the layers 604, 606 and 610. Consequently, defects generated from the layers 604, 606 and 610 during sawing can be effectually eliminated.

According the embodiments described, the weak layer, such as the low dielectric constant layer, in the scribe line areas are removed by photolithography and etching. Further, layers at the high stress region, such as corners of dies, or the easy-crack region, such as the regions neighboring test key, are also removed with photolithography and etching process. Therefore, defects, such as peeling, crack or delamination, generated during sawing can be eliminated to improve production yield.

Figure 7A:
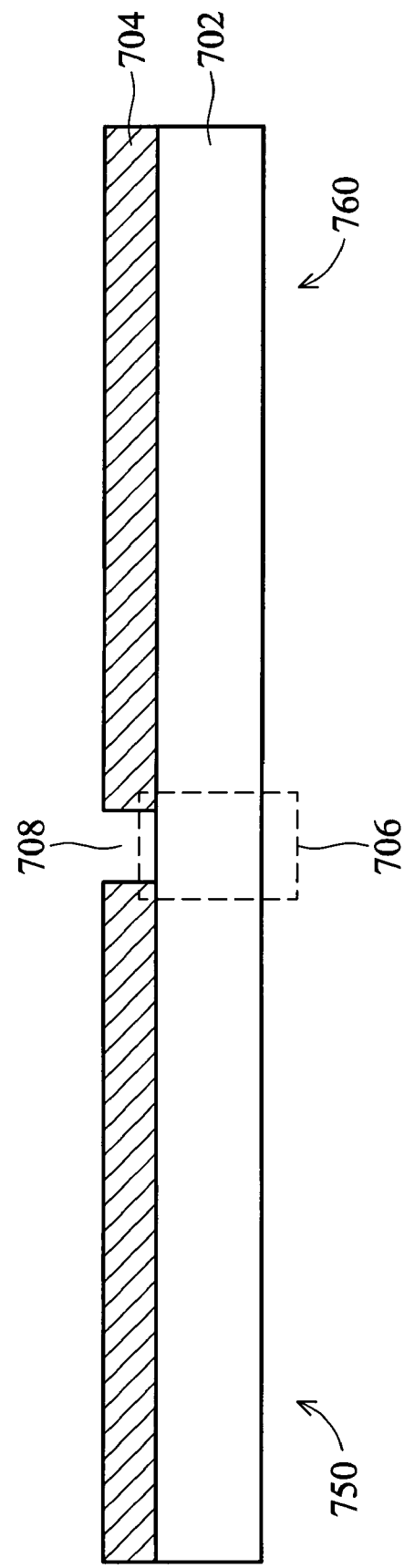
FIGS. 7A~7C show a method for eliminating crack, peeling or delamination when partitioning a multi-wafer of system in package.
Figure 7B:
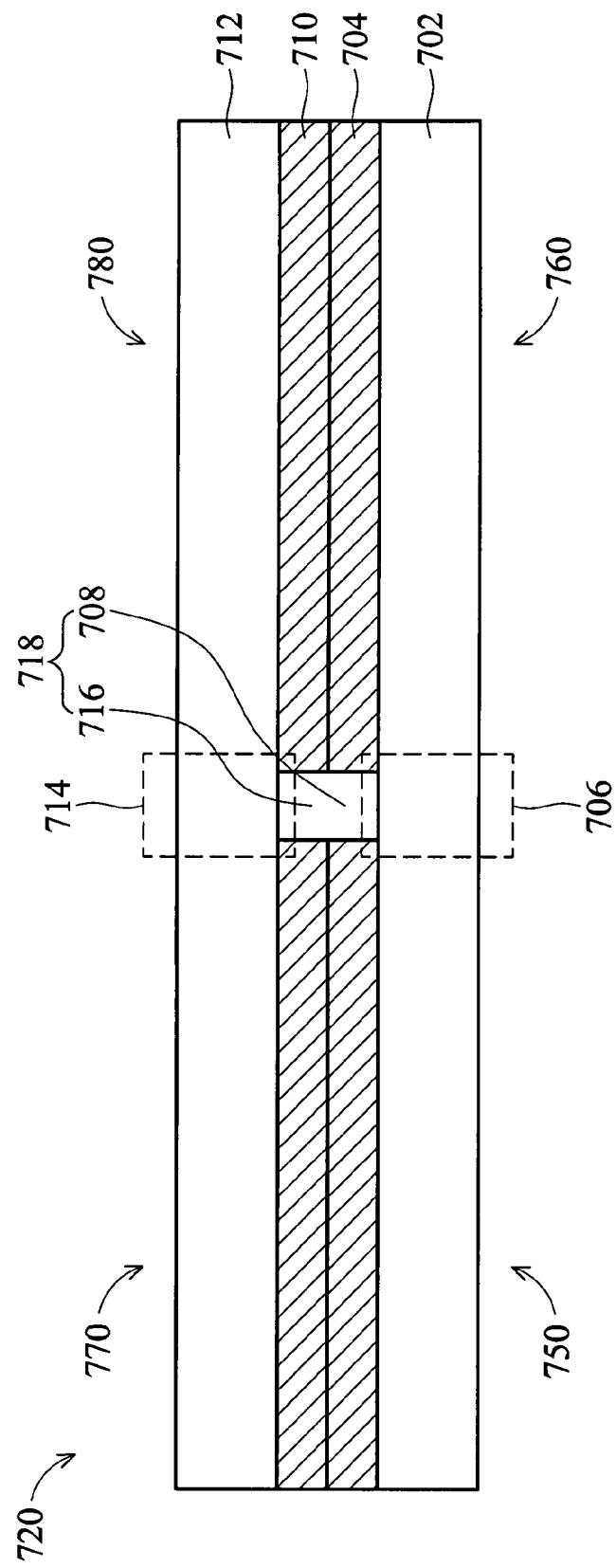
Figure 7C:
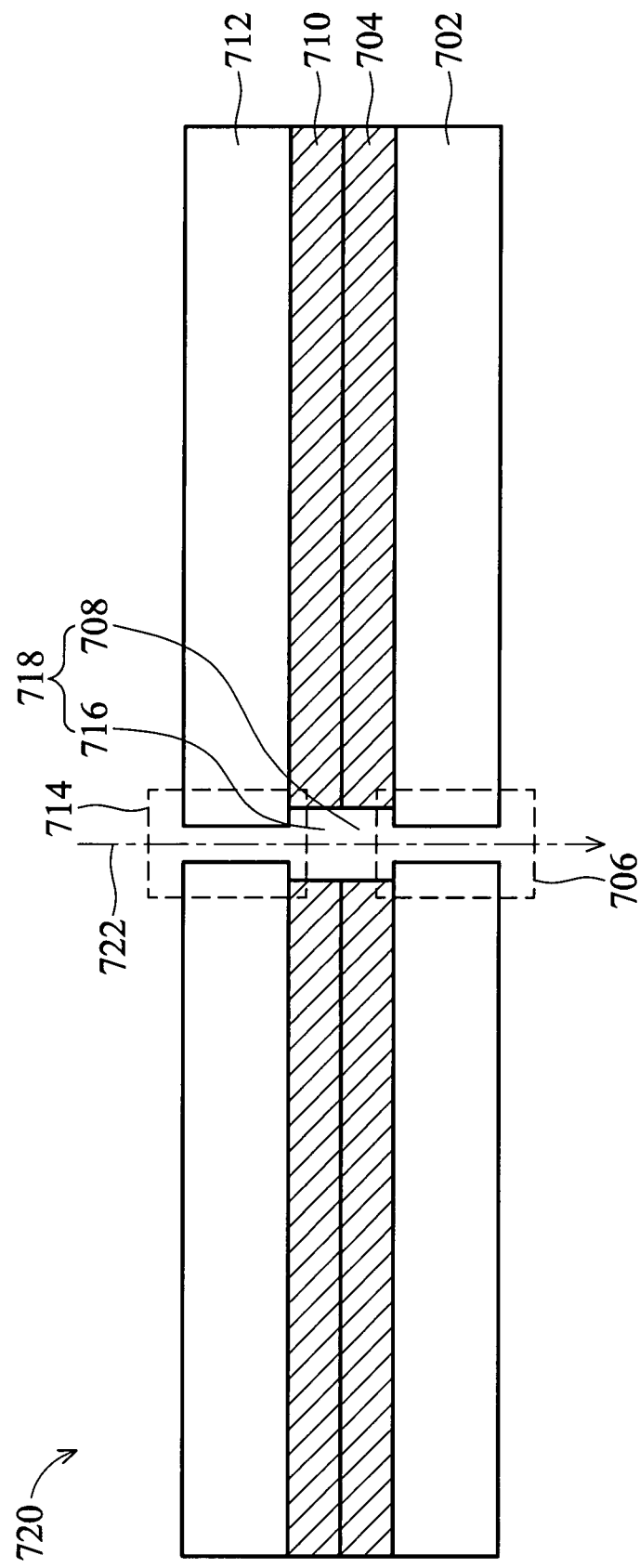

FIGS. 7A~7C show a method for eliminating crack, peeling or delamination when partitioning a multi-wafer of system in package. Referring to FIG. 7A, a first substrate 702, such as a wafer, is provided, and a first structural layer 704 is formed thereon. The first substrate 702 comprise dies 750 and 760 comprising transistors comprising sources, drains, gate electrodes and gate dielectric layers, capacitors and/or other electric elements. The first structural layer 704 can comprise interconnection layer comprising metal lines, vias, inter metal dielectric layers and/or inter layer dielectric layers, which the detail elements are not shown for simplicity. Next, the first structural layer 704 on the substrate is patterned by lithography and etching to form first openings 708 within the first scribe line areas 706, in which the first openings 708 preferably exposing the first substrate 702.

As the method above, a second substrate 712 comprising dies 770 and 780 is provided, and a second structural layer 710 is formed thereon. Next, the second structural layer 710 on the second substrate 712 is patterned by lithography and etching to form second openings 716 within the second scribe line areas 714, in which the second openings 716 preferably exposing the second substrate 712. Thereafter, as shown in FIG. 7B, the second substrate 712 is upside down bonded to the first substrate 702 with the second structural layer 710 contacting the first structural layer 704. In an embodiment of the invention, the first scribe line area 706 is aligned with the second scribe line area 714 during bonding, and the first openings 708 are preferably engaged with the second openings 716 to form a cavity 718 in the stack structure 720.

Next, referring to FIG. 7C, the stack structure 720 is cut along the aligned first and second scribe line areas 706 and 714 preferably by laser beam 722 irradiation to vertically separate bonded the dies. Note that the laser beam 722 preferably passes the cavity 718 formed by patterning the first and second structural layer 704 and 710. Therefore, the cut may not affect the first and second structural layers 704 and 710, and thus crack, peeling or delamination from mechanical stress could be eliminated. Further, due to previous remove of a portion of the first and second structural layers 704 and 710, energy of the laser beam 722 for partitioning the stack structure 720 can be lower, such to reduce cost.

Figure 8A:
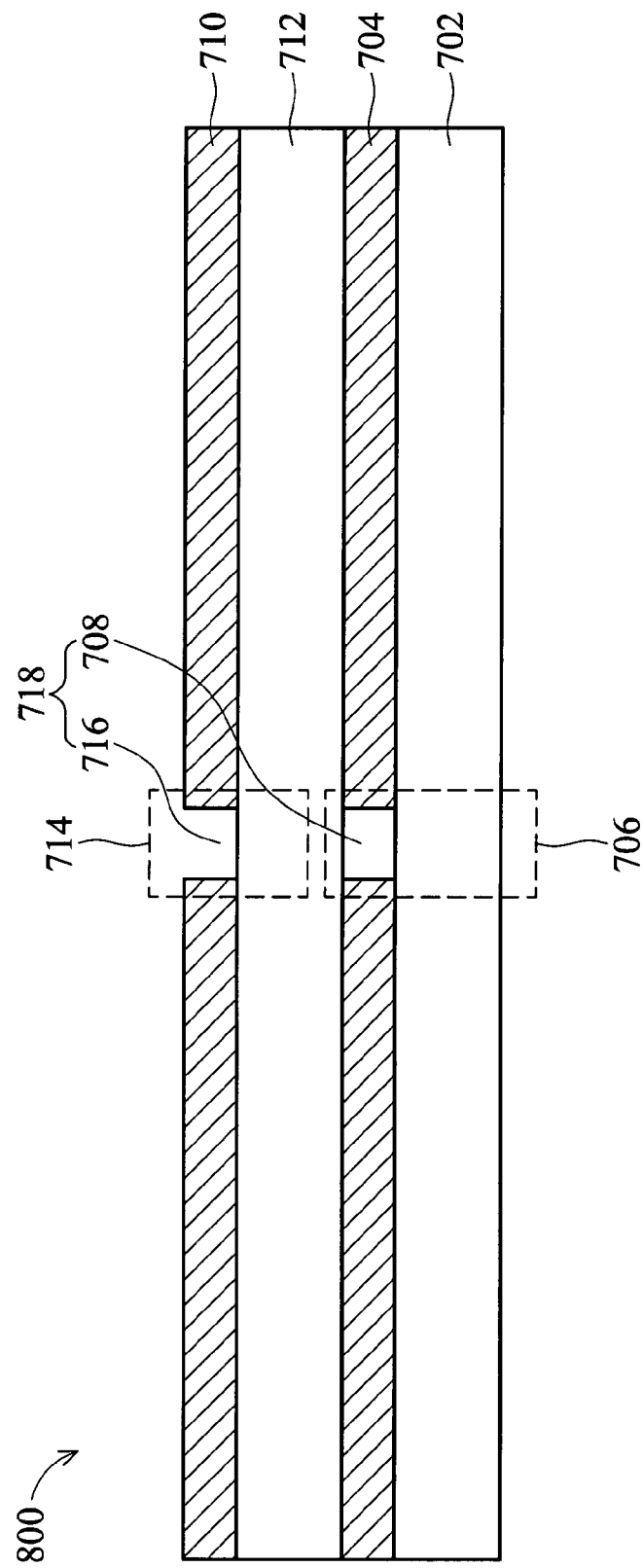
FIGS. 8A~8B show a method for eliminating crack, peeling or delamination when partition a multi-wafer of system in package of another embodiment of the invention.
Figure 8B:
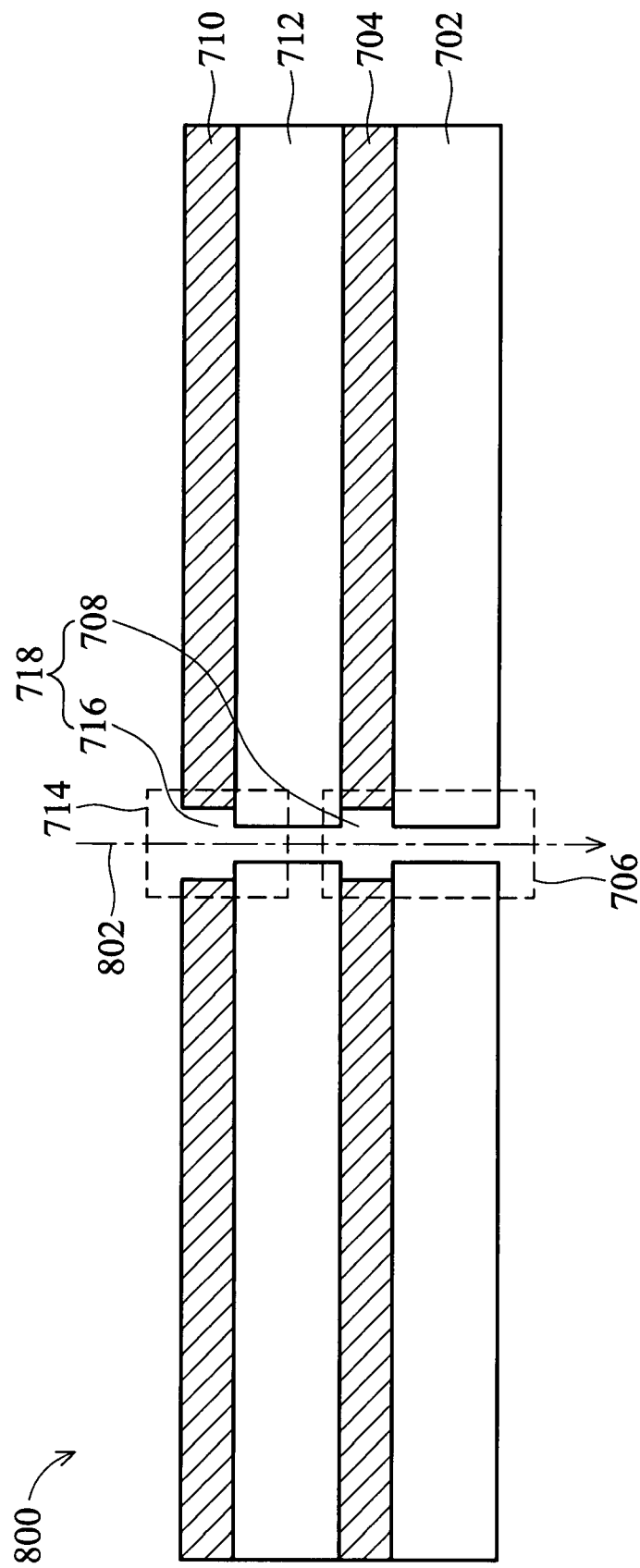

FIGS. 8A~8B show a method for eliminating crack, peeling or delamination when partition a multi-wafer of system in package of another embodiment of the invention. The method of this embodiment is similar to the embodiment of FIGS. 7A~7C, and like elements use the same symbols. The difference between the embodiment and previous one is that, the second substrate 712 is bonded to the first substrate 702 with the second substrate 712 contacting the first structural layer 704 when forming a stack structure 800. The first scribe line area 706 is also aligned with the second scribe line area 714 during bonding. Referring to FIG. 8B, the stack structure 800 is cut along the aligned first and second scribe line areas 706 and 714 preferably by laser beam 802 irradiation. Note that the laser beam 802 preferably passes the first and second openings 708 and 716 formed by patterning the first and second structural layer 704 and 710. Like the effect of the previously embodiment, the cut may also not affect the first and second structural layers 704 and 710, and crack, peeling or delamination from mechanical stress could also be eliminated.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method for forming a device, comprising:
    providing a substrate comprising a plurality of dies, separated by scribe line areas respectively, wherein at least one layer is overlying the substrate;
    removing a portion of the layer within the scribe lines area by photolithography and etching to form openings exposing the substrate, wherein each of the openings has a planar bottom surface substantially having the same level as a top surface of the substrate; and
    sawing the substrate along the scribe line areas through the openings to form scribe lines with a width less than a width of the openings,
    wherein the openings only neighbor corners of the dies.

2. The method for forming a device as claimed in claim 1, wherein the step of removing a portion of the layer within the scribe lines area by photolithography and etching to form openings comprises:
    forming a photoresist layer on the substrate;
    defining the photoresist layer by photolithography to form a photoresist pattern; and
    etching the layer to form the openings using the photoresist pattern as a mask.

3. The method for forming a device as claimed in claim 1, wherein the semiconductor device is disposed in the dies.

4. The method for forming a device as claimed in claim 1, wherein the at least one layer comprises layers of a dielectric layer and a conductive layer.

5. The method for forming a device as claimed in claim 1, wherein the openings are cross shaped.

6. The method for forming a device as claimed in claim 1, wherein the substrate further comprises a plurality of test keys in the scribe line areas, and the step of removing a portion of the layer within the scribe lines area by photolithography and etching to form openings removes the test keys.

7. The method for forming a device as claimed in claim 6, wherein the openings correspond locations of the test keys.

8. The method for forming a device as claimed in claim 1, wherein the step of sawing the substrate along the scribe line areas, passing the openings generates no or less crack, peeling or delamination during sawing.

9. A method for forming a device, comprising:
    providing a substrate comprising a plurality of dies, separated by scribe line areas respectively, wherein at least one layer is overlying the substrate;
    patterning the layer to form openings exposing the substrate and only neighboring corners of the dies by lithography and etching, wherein each of the openings has a planar bottom surface substantially having the same level as a top surface of the substrate; and
    sawing the substrate along the scribe line areas through the openings to form scribe lines with a width less than a width of the openings.

10. The method for forming a device as claimed in claim 9, wherein the opening is cross-shaped.

* * * * *